(12) United States Patent
Dias et al.

(10) Patent No.: US 7,078,822 B2
(45) Date of Patent: Jul. 18, 2006

(54) MICROELECTRONIC DEVICE INTERCONNECTS

(75) Inventors: Rajen Dias, Phoenix, AZ (US); Biju Chandran, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 485 days.

(21) Appl. No.: 10/183,874

(22) Filed: Jun. 25, 2002

(65) Prior Publication Data

US 2003/0234277 A1 Dec. 25, 2003

(51) Int. Cl.
*H01L 23/48* (2006.01)

(52) U.S. Cl. .................. 257/786; 257/773; 257/782
(58) Field of Classification Search .......... 257/700, 257/701, 758, 773, 782, 786, 257
See application file for complete search history.

(56) References Cited

U.S. PATENT DOCUMENTS 5,739,587 A * 4/1998 Sato ..................... 257/758
6,593,643 B1 * 7/2003 Seki et al. ............. 257/677

OTHER PUBLICATIONS

Wolf et al., Silicon Processing for the VLSI Era, 2000, vol. I, Lattice Press, 851–852.*

* cited by examiner

*Primary Examiner*—Leonardo Andujar
(74) *Attorney, Agent, or Firm*—Rob G. Winkle

(57) ABSTRACT

A microelectronic assembly including a plurality of conductive columns extending from a bond pad of a microelectronic device and a conductive adhesive on a land pad of a carrier substrate electrically attached to the conductive columns.

12 Claims, 5 Drawing Sheets

MICROELECTRONIC DEVICE INTERCONNECTS

BACKGROUND OF THE INVENTION

1. Field of the Invention

The present invention relates to interconnects used to attach a microelectronic device to a carrier substrate. In particular, the present invention relates to fabricating a plurality of projections extending from the microelectronic device bond pad to form a compliant interconnect.

2. State of the Art

Various methods are used to make electrical contact between a microelectronic device and a carrier substrate, including but not limited to, TAB bonding, wire bonding, and solder ball interconnects. Solder ball interconnects are particularly useful with microelectronic devices which have a high number of input/output signal connections.

FIG. 5 illustrates an assembly 200 comprising a microelectronic device 202 (illustrated as a flip chip) physically and electrically attached by an active surface 204 thereof to a connection surface 206 of a carrier substrate 208 by a plurality of interconnects 212, such as solder balls, extending between bond pads 214 on the microelectronic device active surface 204 and land pads 216 on the carrier substrate connection surface 206. An underfill material 218 may be disposed between the microelectronic device active surface 204 and the carrier substrate connection surface 206 to prevent contamination and to increase mechanical reliability.

FIG. 6 illustrates a view of a single interconnect comprising a metal column 222, such as a copper column, formed on the microelectronic device bond pad 214. The metal column 222 is used for achieving a sufficient current flow through each interconnect 212 and to prevent electromigration, as will be understood to those skilled in the art. The metal column 222 is attached to the carrier substrate land pad 216 with a layer of conductive adhesive 224, such as a solder material. A resist material 226 may be patterned to contain the conductive adhesive 224, as known in the art, prior to the attachment of the metal column 222.

The metal column 222 is usually has an aspect ratio (height to width) of between about 1 and 2. The metal column 222 is also usually made of a highly conductive material, such as copper, gold, tin, and the like. However, such highly conductive materials generally have a high elastic modulus. The high elastic modulus of the metal column 222 coupled with a large coefficient of thermal expansion ("CTE") mismatch between the microelectronic device 202, and the carrier substrate 208 can generate significant stresses, which is transferred to thin films which make up at least a portion of the integrated circuitry (not shown) on the microelectronic device active surface 204. These stresses can result in cracking and/or delamination of these thin films. The potential for cracking and delamination is a particular concern in the use of low K dielectric materials, such as CDO, SiLK, fluorocarbons, and the like, used in the fabrication of the build-up layers. Of course, such cracking and/or delamination can result in the failure of the microelectronic device 202.

Therefore, it would be advantageous to develop an interconnect that reduces or substantially eliminates the possibility of cracking and/or delamination, and processes for forming the interconnect.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE ILLUSTRATED EMBODIMENT

Figure 1:
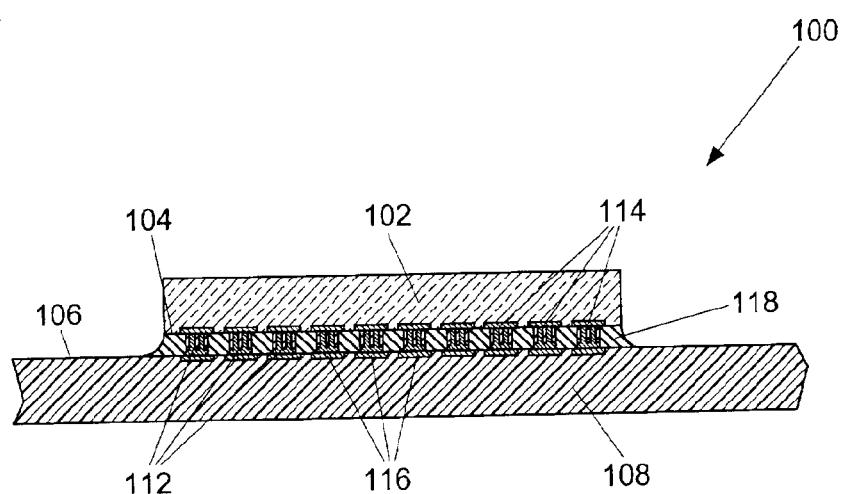
FIG. 1 is a side cross-sectional view of a microelectronic device, according to the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The term "carrier substrate" is defined to include, but is not limited to, interposers, land grid arrays, motherboards, peripheral cards, cartridges, multi-chip module substrates, and similar structures as will be evident to one skilled in the art.

The present invention includes microelectronic device interconnects comprising a plurality of conductive columns extending from a bond pad of a microelectronic device. A conductive adhesive (or a solder) on a land pad of a carrier substrate is electrically attached to the conductive columns.

FIG. 1 illustrates an assembly 100 comprising a microelectronic device 102 (illustrated as a flip chip) physically and electrically attached by an active surface 104 thereof to a connection surface 106 of a carrier substrate 108 by a plurality of interconnects 112 extending between bond pads 114 on the microelectronic device active surface 104 and corresponding land pads 116 on the carrier substrate connection surface 106. An underfill material 118 may be disposed between the microelectronic device active surface 104 and the carrier substrate connection surface 106. The underfill material 118 may include, but is not limited to the following chemistries: epoxies, cyanate esters, silicones, and the like. Typically, the underfill materials contain reinforcing particles, such as silica (preferred), alumina, or Teflon®.

Figure 2:
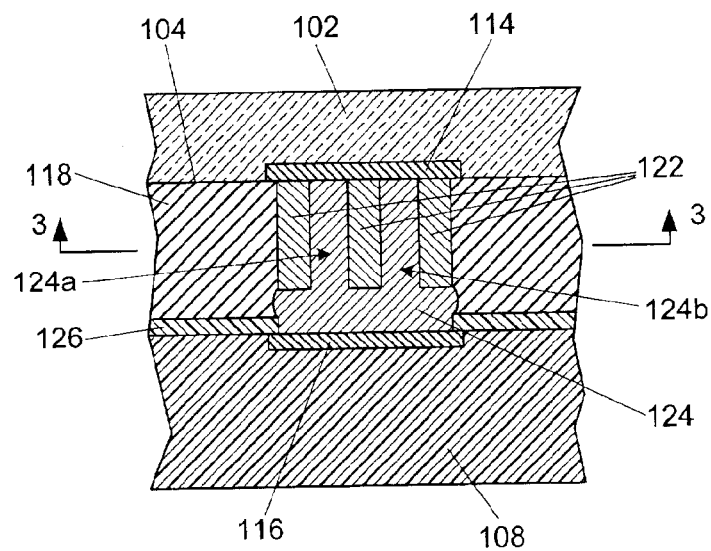
FIG. 2 is a side cross-sectional view of a single interconnect extending between a microelectronic device and a carrier substrate, according to the present invention.

FIG. 2 illustrates an embodiment of a single interconnect 112 comprising a plurality of conductive columns 122 extending from the microelectronic device bond pad 114. The conductive columns 122 may be formed of any electrically conductive material, including but not limited to copper (preferred), aluminum, gold, silver, alloys thereof, and the like. The conductive columns 122 are preferably discrete, i.e., separate from one another, and preferably have an aspect ratio (i.e., height to width ratio) of over about 3.

The conductive columns 122 are attached to the carrier substrate land pad 116 with a layer of conductive adhesive 124. The conductive adhesive 124 may be any appropriate material, including but not limited to, solder materials and metal-filled polymers. The solder materials may include, but are not limited to, lead, tin, indium, gallium, bismuth, cadmium, zinc, copper, gold, silver, antimony, germanium, and alloys thereof (preferably, silver/lead/tin alloys or eutectic tin/silver alloys). The metal-filled polymers may include a matrix material, such as an epoxy, filled with a metal power/fragments, such as copper (preferred), aluminum, silver, and the like. A resist material 126 may be patterned to contain the conductive adhesive 124 (i.e., the resist material 126 will not be wetted by the conductive adhesive 124), as known in the art, prior to the attachment of the conductive columns 122. As shown in FIG. 2, a portion of the conductive adhesive 124 is disposed between the conductive columns 122 (illustrated as elements 124a and 124b).

The use of a plurality of conductive columns 122 results in an interconnect 112 that is more compliant or flexible than an interconnect having a single metal column, as previously discussed. Thus, the interconnect 112 is less likely to translate the stresses due to CTE mismatch (as previously discussed) to the thin films which form at least a portion of the integrated circuitry (not shown) of the microelectronic device 102, which, in turn, substantially reduces or eliminates delamination and cracking of the thin films. Furthermore, the use of a plurality of conductive columns 122 also be improve conductive adhesive 124 joint fatigue resistance due to the interfaces between the conductive adhesive 124 and the conductive columns 122 acting as crack arresters, as will be understood to those skilled in the art.

Figure 3A:
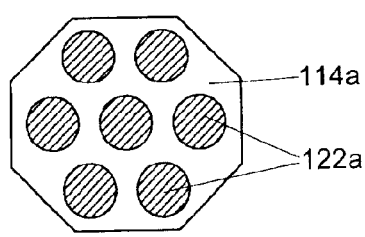
FIGS. 3a–3f are cross-sectional plan views of the interconnect along line 3—3 of FIG. 2 without the presence of the conductive adhesive, according to the present invention.
Figure 3B:
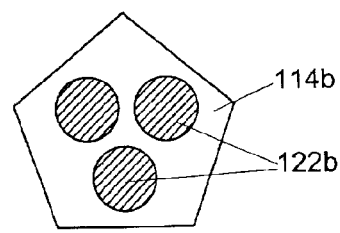
Figure 3C:
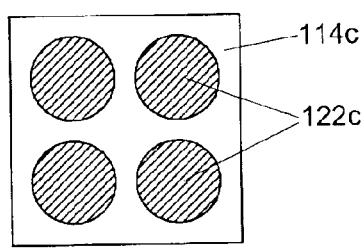
Figure 3D:
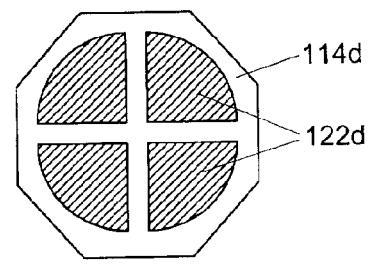
Figure 3E:
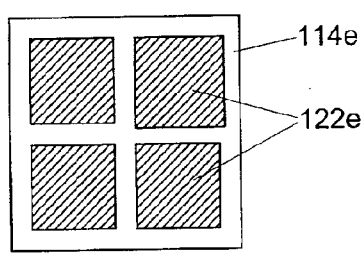
Figure 3F:
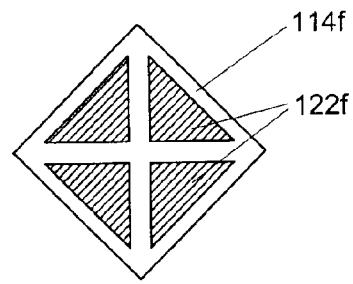

As shown in FIGS. 3a through 3f, the microelectronic device bond pads may have any appropriate shape and the conductive columns may have any appropriate cross-sectional shape and number. The figures are plan views looking generally along line 3—3 of FIG. 2 toward the microelectronic device 102 without the conductive adhesive 124. For example, as shown in FIG. 3a, the bond pad 114a may be substantially octagonal and the cross-sectional shape of the conductive columns 122a may be substantially circular (shown with 7 conductive columns 122a). As shown in FIG. 3b, the bond pad 114b may be substantially pentagonal and the cross-sectional shape of the conductive columns 122b may be substantially circular (shown with 3 conductive columns 122b). As shown in FIG. 3c, the bond pad 114c may be substantially square and the cross-sectional shape of the conductive columns 122c may be substantially circular (shown with 4 conductive columns 122c). As shown in FIG. 3d, the bond pad 114d may be substantially octagonal and the cross-sectional shape of the conductive columns 122d may be substantially pie-slice shape (shown with 4 conductive columns 122d). As shown in FIG. 3e, the bond pad 114e may be substantially square and the cross-sectional shape of the conductive columns 122e may also be substantially square (shown with 4 conductive columns 122e). As shown in FIG. 3f, the bond pad 114f may be substantially diamond-shaped and the cross-sectional shape of the conductive columns 122f may be substantially triangular (shown with 4 conductive columns 122f). It is, of course, understood that the configurations shown in FIGS. 3a–3f are merely exemplary, as the bond pad may be any suitable shape, and the conductive columns may be any suitable cross-sectional shape. Furthermore, there may be any number conductive columns 122 depending on functionality, location, and space restrictions, as will be understood by those skilled in the art. Of course, it is also understood that a sufficient number conductive column 122 should be connected to a single bump pad 114 to meet the requisite current requirements.

Figure 4A:
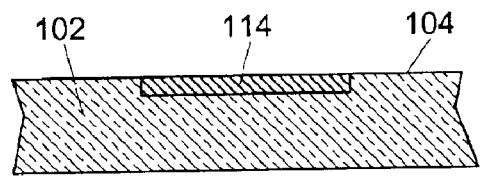
FIGS. 4a–4f are a side cross-sectional views of one embodiment of fabricating an interconnect, according to the present invention.
Figure 4B:
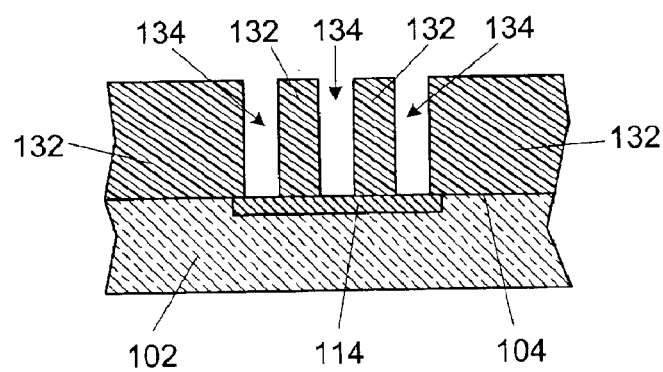
Figure 4C:
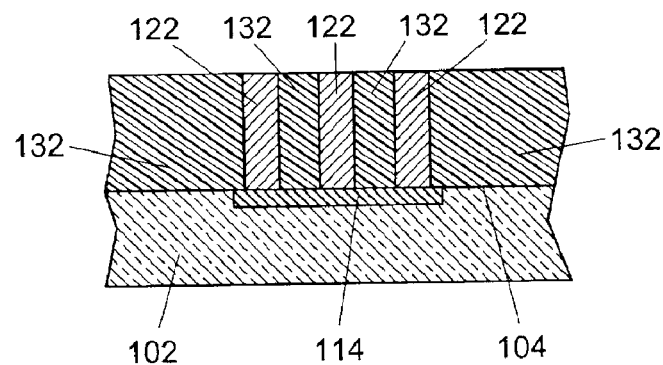

FIGS. 4a–4f illustrate one embodiment of a method of fabrication of the present invention. As shown in FIG. 4a, the microelectronic device 102 is provided having a bond pad 114 on its active surface 104. It is, of course, understood that the bond pad is in electrical contact with integrated circuitry (not shown) within the microelectronic device 102, as well known in the art. As shown in FIG. 4b mask 132, such as a positive or negative resist material as known in the art, is deposited on the microelectronic device active surface 104. The mask 132 is patterned to have a plurality of openings 134 extending therethrough over the microelectronic device bond pad 114. As shown in FIG. 4c, a conductive material, such as copper (preferred), aluminum, gold, silver, alloys thereof, and the like, is disposed in the openings 134 (see FIG. 4b) to form conductive columns 122. The conductive material may be disposed in the opening by any technique known in the art, but is preferably achieved with a plating technique, either electrolytic or electrode-less plating. As it will be noted, the openings 134 of FIG. 4b are patterned to be the desired shape of conductive columns 122 and the thickness of the mask 132 may be controlled to achieve a desired aspect ratio of the conductive columns 122.

Figure 4D:
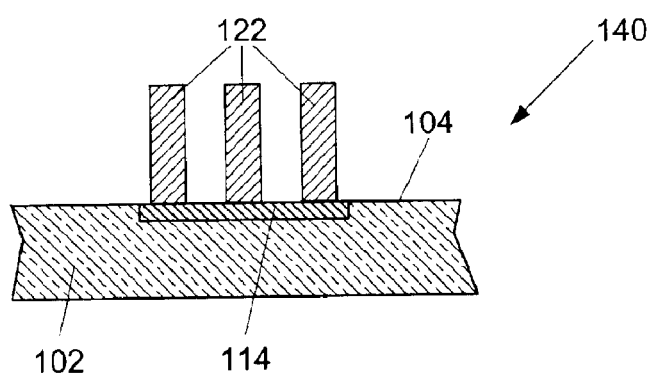
Figure 4E:
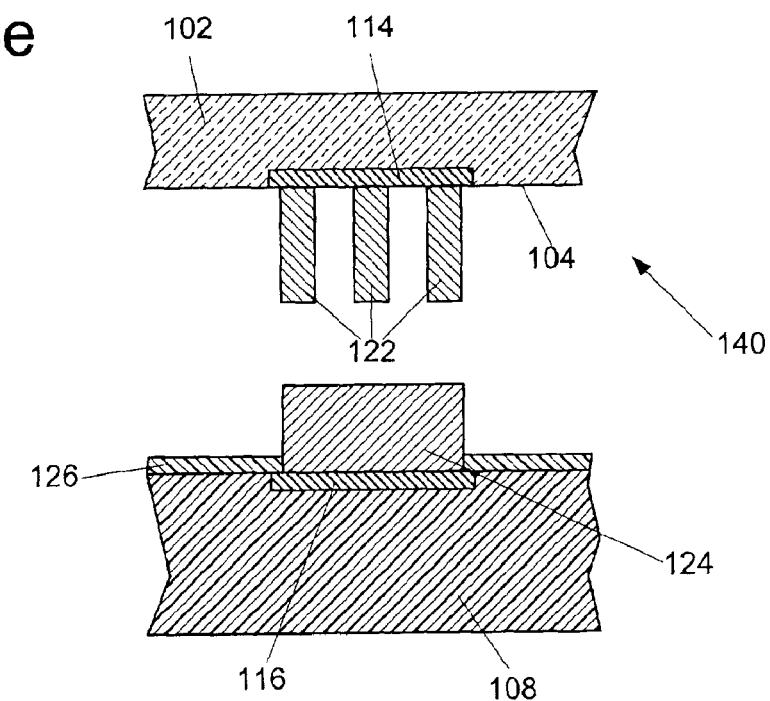

It is, of course, understood that a variety of other methods could be used to fabricate the plurality of conductive columns 122. For example, a plurality of thin wires, such as copper (preferred), aluminum, gold, silver, alloys thereof, and the like, could be attached directly to the bond pad 114, thereby directly forming the conductive columns 122, as shown in FIG. 4d. The thin wires may be achieved by any method known in the art, including, but not limited to thermosonic wire bonding.

Once the conductive columns 122 are formed, the mask 132 is removed, such as by dissolution with an appropriate solvent, to form structure 140. The structure 140 is then oriented over the carrier substrate 108 to align the microelectronic device bond pad 114 with its corresponding carrier substrate land pad 116. The carrier substrate land pad 116 has the conductive adhesive 124 patterned thereon with the resist material 126 disposed on the microelectronic device active surface 104 surrounding the conductive adhesive 124.

Figure 4F:
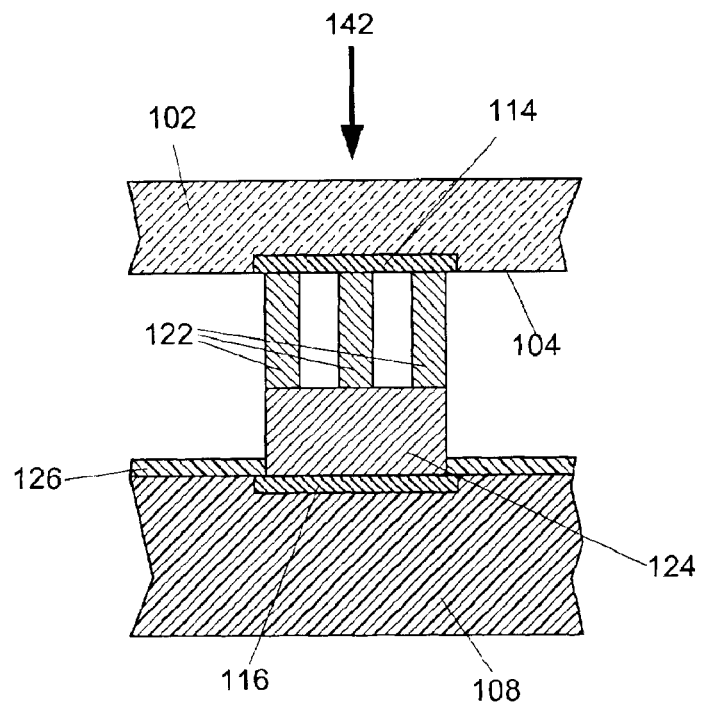
Figure 5:
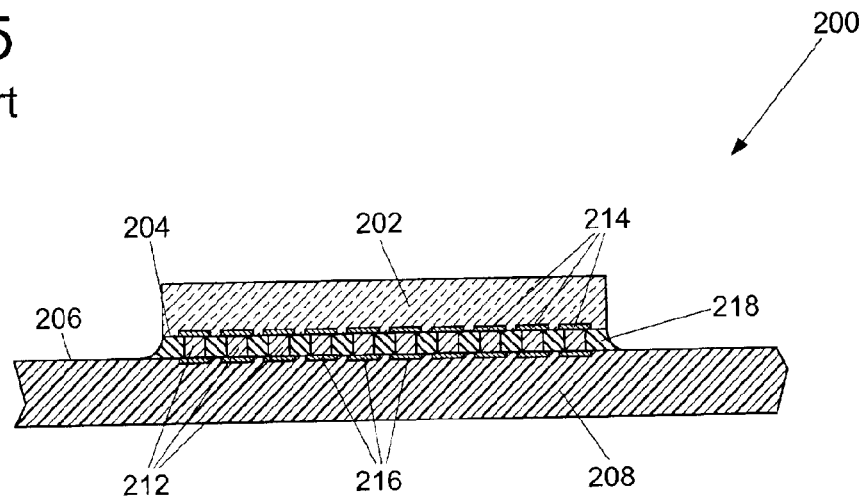
FIG. 5 is a side cross-sectional view of a microelectronic device, as known in the art.
Figure 6:
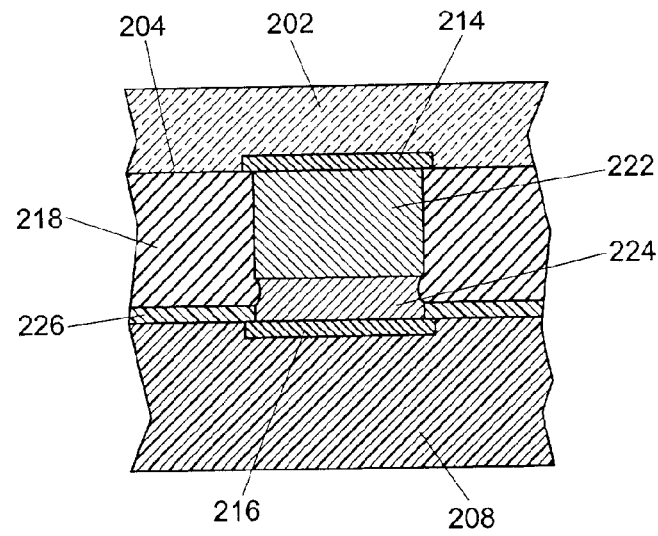
FIG. 6 is a side cross-sectional view of a single interconnect extending between a microelectronic device and a carrier substrate, as known in the art.

As shown in FIG. 4f, the conductive columns 122 are brought into contact with the conductive adhesive 124. The material used for the conductive adhesive 124 will determine how the conductive columns 122 will be affixed in the conductive adhesive 124. For example, when a solder material is used for the conductive adhesive 124. The conductive adhesive 124 is brought to its reflow temperature and the conductive columns 122 are inserted into the reflowed conductive adhesive 124, wherein a portion of the conductive adhesive 124 wicks by capillary action to bridge gaps between adjacent conductive columns 122 to form the structure shown in FIG. 2. Preferably, as shown in FIG. 2, the conductive adhesive 124 contacts a portion of the bond pad 114. However, the conductive columns 122, generally, do not contact the land pads 116. The reflowed conductive adhesive 124 is then resolidified.

In another example, when a conductive epoxy or the like is used, for the conductive adhesive 124 may be partially cured and the conductive columns 122 are pressed into the partially cured conductive adhesive 124. The conductive adhesive 124 is then fully cured to form the structure shown in FIG. 2.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A microelectronic assembly, comprising:
    a microelectronic device having an active surface and having at least one bond pad on said microelectronic device active surface; and
    a plurality of conductive columns extending from said at least one microelectronic device bond pad, wherein said plurality of conductive columns each have an aspect ratio of greater than about 3.

2. The assembly of claim 1, wherein said plurality of conductive columns comprise metal plated on said at least one microelectronic bond pad.

3. The assembly of claim 2, wherein said metal comprises a metal selected from the group consisting of copper, aluminum, gold, and silver.

4. The assembly of claim 1, wherein said plurality of conductive columns comprise metal wires attached to said at least one microelectronic bond pad.

5. The assembly of claim 4, wherein said metal wire comprises a metal wire selected from the group consisting of copper, aluminum, gold, and silver.

6. A microelectronic assembly, comprising:
    a microelectronic device having an active surface and having at least one bond pad on said microelectronic device active surface;
    a plurality of conductive columns extending from said at least one microelectronic device bond pad;
    a carrier substrate having at least one land pad disposed thereon; and
    a conductive adhesive on said at least one carrier substrate land pad, wherein said plurality of conductive columns extend into said conductive adhesive.

7. The assembly of claim 6, wherein said conductive adhesive comprises a solder material.

8. The assembly of claim 7, wherein said solder material comprises a material selected from the group consisting of lead, tin, indium, gallium, bismuth, cadmium, zinc, copper, gold, silver, antimony, and germanium.

9. The assembly of claim 7, wherein said solder material comprises a silver/lead/tin alloy.

10. The assembly of claim 7, wherein said solder material comprises a eutectic tin/silver alloy.

11. The assembly of claim 6, wherein said conductive adhesive comprises a metal-filled polymer.

12. The assembly of claim 11, wherein said metal-filled polymer comprises a copper-filled epoxy.

\* \* \* \* \*